(12) United States Patent
Sievers

(10) Patent No.: US 8,013,887 B2
(45) Date of Patent: *Sep. 6, 2011

(54) BEAM ILLUMINATION SYSTEM AND METHOD FOR PRODUCING PRINTING PLATES

(75) Inventor: Wolfgang Sievers, Kremperheide (DE)

(73) Assignee: Esko-Graphics Imaging GmbH, Itzehoe (DE)

( * ) Notice: Subject to any disclaimer, the term of this patent is extended or adjusted under 35 U.S.C. 154(b) by 461 days.

This patent is subject to a terminal disclaimer.

(21) Appl. No.: 11/840,796

(22) Filed: Aug. 17, 2007

(65) Prior Publication Data

US 2008/0030569 A1    Feb. 7, 2008

Related U.S. Application Data

(63) Continuation of application No. 11/016,700, filed on Dec. 16, 2004, now Pat. No. 7,265,772.

(51) Int. Cl.
*B41J 2/455* (2006.01)
(52) U.S. Cl. ...................................... 347/233
(58) Field of Classification Search .............. 347/233, 347/238; 250/494.1; 385/118; 606/10
See application file for complete search history.

(56) References Cited

U.S. PATENT DOCUMENTS

| | | | |
|---|---|---|---|
| 2,853,921 A | 9/1958 | Friedrich et al. | |
| 3,260,621 A | 7/1966 | Shaw et al. | |
| 4,830,460 A * | 5/1989 | Goldenberg | 385/118 |
| 4,925,523 A | 5/1990 | Braren et al. | 216/66 |
| 4,947,023 A | 8/1990 | Minamida et al. | 219/121.68 |
| 5,367,143 A | 11/1994 | White, Jr. | 219/121.68 |
| 5,530,709 A | 6/1996 | Waarts et al. | 372/6 |
| 5,746,738 A | 5/1998 | Cleary et al. | 606/15 |
| 5,856,841 A | 1/1999 | Shinohara et al. | 347/143 |
| 6,037,964 A * | 3/2000 | Gomi et al. | 347/238 |
| 6,063,546 A | 5/2000 | Gelbart | 430/306 |
| 6,120,951 A | 9/2000 | Klein et al. | 430/30 |
| 6,141,030 A * | 10/2000 | Fujita et al. | 347/233 |
| 6,150,629 A | 11/2000 | Sievers | 219/121.62 |
| 6,204,875 B1 | 3/2001 | De Loor et al. | 347/241 |

(Continued)

FOREIGN PATENT DOCUMENTS

DE    004212390 A1    10/1993

(Continued)

OTHER PUBLICATIONS

"White Paper: Cyrel Digital Imager CtP Flexo System." *Esko-Graphics*, Gent, Belgium. Available online at http://www.esko-graphics.com/files/pdf/_other/EG_wp010dfus.pdf.

(Continued)

*Primary Examiner* — Stephen D Meier
*Assistant Examiner* — Carlos A Martinez, Jr.
(74) *Attorney, Agent, or Firm* — Dov Rosenfeld; Inventek

(57) ABSTRACT

Images are transferred to printing plates by illuminating light-responsive materials with patterns corresponding to the images to be printed. The present invention provides for the transferring of an image by the combined flux from two or more beams of light. Particular embodiments ablate the mask printing plates for CTP systems by the combined illumination from a first, broad beam and a plurality of controllable, pulsed beams that co-illuminate the plate with the first beam. The resulting system and method is less expensive than the prior art and produces a printing plate more efficiently and with improved productivity than the prior art.

23 Claims, 7 Drawing Sheets

U.S. PATENT DOCUMENTS

| | | | |
|---|---|---|---|
| 6,229,650 B1 | 5/2001 | Reznichenko et al. | 359/566 |
| 6,433,934 B1 | 8/2002 | Reznichenko et al. | 359/622 |
| 6,527,764 B1 * | 3/2003 | Neuberger et al. | 606/10 |
| 6,700,598 B1 | 3/2004 | Hull | 347/238 |
| 6,727,982 B2 | 4/2004 | Kawashima et al. | 355/70 |
| 7,265,772 B2 * | 9/2007 | Sievers | 347/233 |
| 2002/0130279 A1 * | 9/2002 | Jain et al. | 250/494.1 |
| 2004/0157162 A1 | 8/2004 | Yokota et al. | 430/306 |

FOREIGN PATENT DOCUMENTS

| | | |
|---|---|---|
| EP | 0992350 | 4/2000 |
| FR | 1021016 | 2/1953 |

OTHER PUBLICATIONS

"PYL Series: 5, 10, 50, and 100 Watts: Single-Mode, 'CW Ytterbium Fiber Lasers (OEM Units)." Jan. 2002. IPG Photonics, Oxford, MA. [NPL document from 10/442666].

Office Action to U.S. Appl. No. 11/016,700 mailed Nov. 3, 2006.

Office Action to U.S. Appl. No. 11/016,700 mailed Apr. 5, 2007.

Extended Search Report on EP Application No. 05027152.7 mailed Jul. 7, 2009.

Official Communication mailed Mar. 14, 2011 from the European Patent Office Examining Division for Application 05027152.7.

* cited by examiner

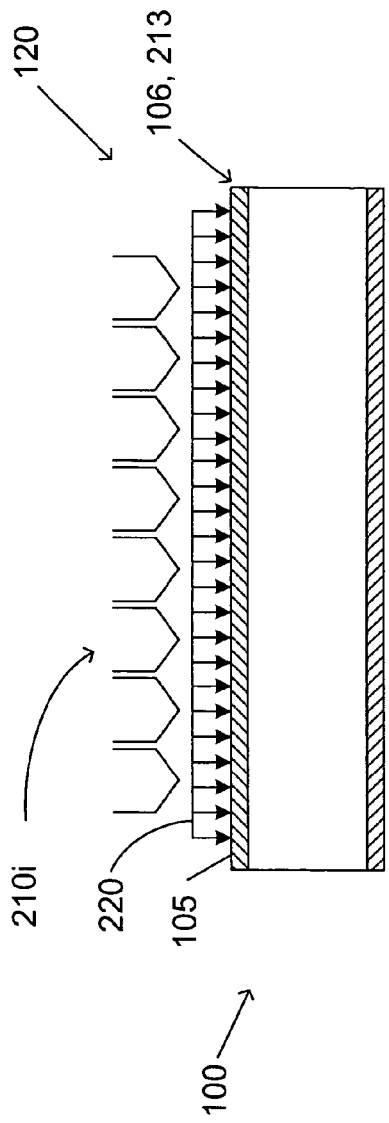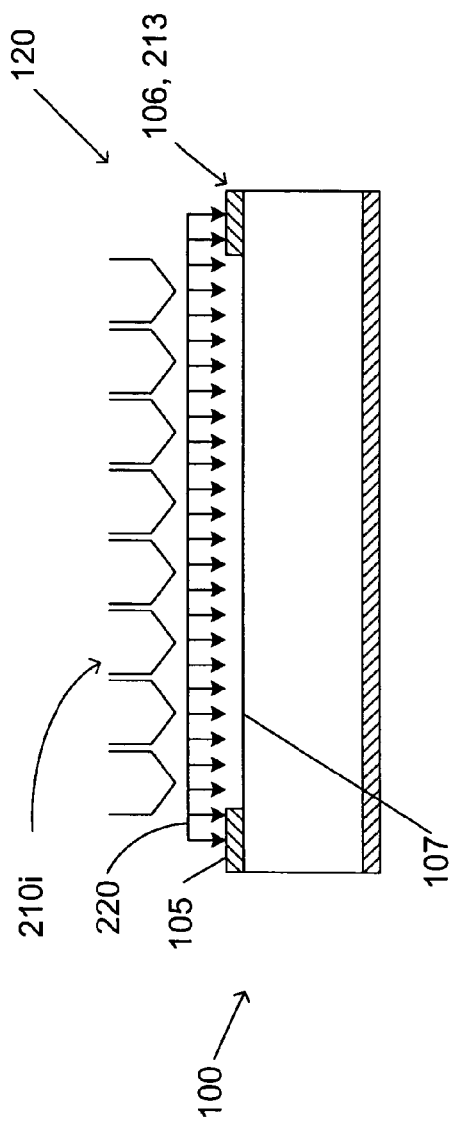

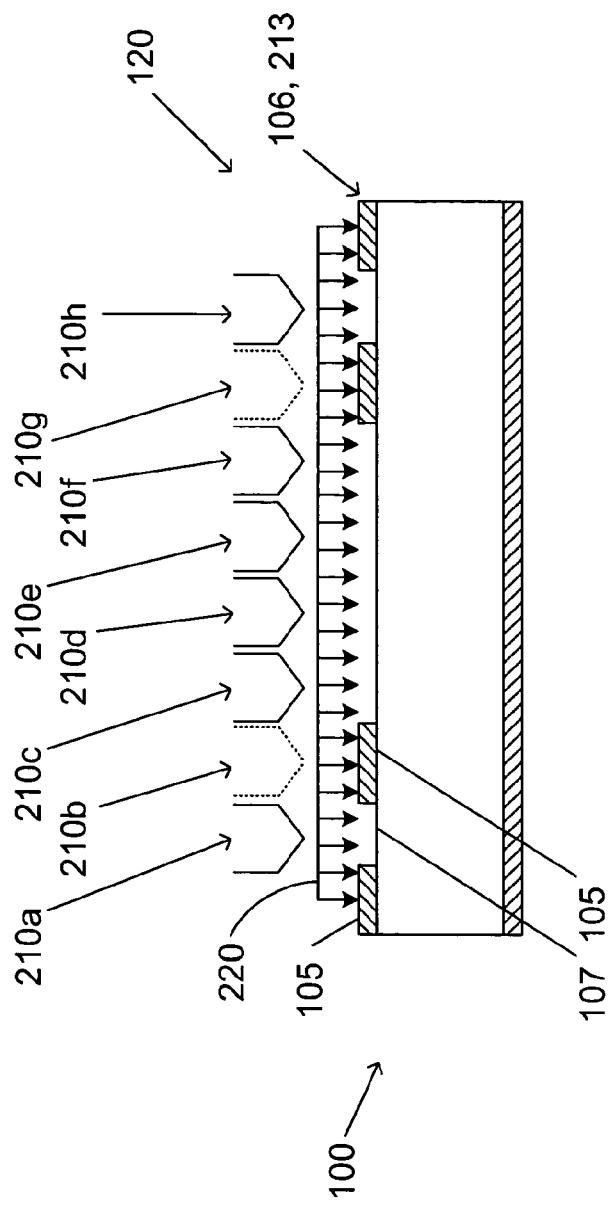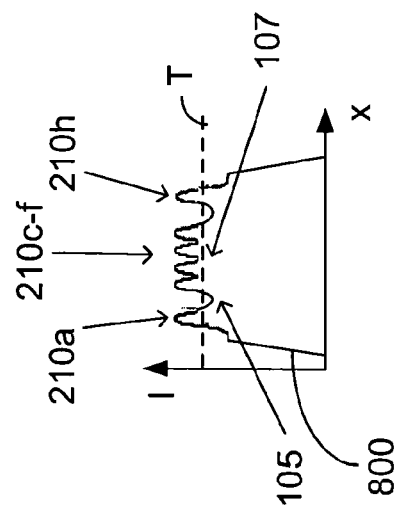
FIG. 7
FIG. 8

US 8,013,887 B2

BEAM ILLUMINATION SYSTEM AND METHOD FOR PRODUCING PRINTING PLATES

RELATED APPLICATIONS

The present invention is a continuation of U.S. patent application Ser. No. 11/016,700 to Sievers, filed Dec. 16, 2004 now U.S. Pat. No. 7,265,772. The contents of such U.S. patent application Ser. No. 11/016,700 are incorporated herein by reference.

BACKGROUND OF THE INVENTION

1. Field of the Invention

The present invention generally relates to the production of printing plates, and more particularly to a method and system for transferring images by exposing photo-sensitive printing plates.

2. Discussion of the Background

In the graphic arts and printing industries, high-resolution images are formed by exposing a light-sensitizable medium, such as a printing plate, with an appropriate light pattern. By light is meant electromagnetic radiation such as UV, visible-light, or IR radiation. Traditionally, image transfer to printing plates is accomplished by covering the plate with a patterned film and exposing the plate through the film with broadband electromagnetic radiation, e.g., UV or visible light. Thus, for example, the illuminated areas can induce curing of a polymeric light-sensitizable medium. The exposed plates are then processed to remove the unexposed areas, resulting in cured, raised portions that can accept ink for printing.

More recently, systems have been developed that do not use film intermediaries. One such system is the so-called computer-to-plate (CTP) system, where computer generated or processed images are transferred to a printing plate without an intermediary film. Such methods use plates having a light-sensitizable medium, including but not limited to traditional plates, with an integral mask front-surface. Image transfer to the CTP plates is performed by ablating the mask in a pattern corresponding to the image to be printed with electromagnetic radiation, e.g., IR from a digital laser imaging system.

It is a common feature of most CTP imaging systems that the ablation of any specific location on a CTP plate is accomplished by the modulation of the intensity of light beams on the surface. The modulation of the light beam on the surface can occur, for example, by modulating the intensity of a light beam as it scans the surface. In addition, a CTP imaging system may have multiple beams that each ablate different portions, sections, or scan lines of a CTP plate.

In one prior art system, for example, a digital imaging system includes a drum on which the plate is mounted and can rotate across the focal area of an imaging system. With the drum rapidly rotating, the focal area of the light source via the imaging system advances relative to the plate on the drum along the drum's longitudinal direction of the drum. Typically, such longitudinal direction is called the slow scan direction and the direction of motion of the focal area on the plate along the circumference as the drum rotates is called the fast scan direction and is substantially perpendicular to the slow scan direction. The illumination intensity is varied with time, resulting in an ablated mask having the desired image pattern. The plates are then exposed and processed using techniques similar to those of traditional plates.

One measure of the productivity of a CTP system is the rate at which the imaging system can transfer an image to the printing plate. Improved productivity of CTP systems has been achieved by increasing the power of each imaging spot focused on a plate, and also by increasing the number of imaging spots of the imaging system. Thus, for example, early polymer plate CTP systems included a single laser-beam imaging system with a power of 0.5 Watts and were capable of scanning the plate's surface at 0.1 $m^2$/hour. The productivity of prior art CTP imaging systems has typically been improved by increasing the number of laser beams in an imaging system. Thus, for example, a 64 laser-beam imaging system with a power of 30-40 Watts is capable of scanning the plate surface at up to 4-5 $m^2$/hour.

Several approaches have been attempted to improve the productivity of CTP systems. A first approach includes the use of laser diodes each having controllable, modulated powers, where the lasers are arranged either as single emitters or as individual addressable bars. Improved productivity of systems using this approach is provided by increasing the number of emitters. A second approach includes using a plurality of adjacent fiber lasers beams each modulated by their own acousto-optical modulator. A third approach uses one fiber laser beam and an acousto-optical deflector to deflect the beam in a several directions by powering the deflector with several different frequencies at the same time.

While the use of each of these approaches can improve CTP productivity, each approach is limited and has problems that prevent significant improvements over the prior art. For approaches using multiple lasers, it is difficult to provide the required optics at the close spacing required for high resolution CTP systems. The high resolution also requires that each beam is of high quality, adding to the expense of the light source. Another common problem is that of the condensation of ablated material back onto the plate. As the ablated material expands from the plate surface, it can condense on surrounding areas, resulting in residual mask material that affects the quality of the plate.

Thus there is a need in the art for a method and apparatus that permits for an increased scanning speed of CTP digital imaging systems. Such a method and apparatus should be compatible with prior art printing plates, should increase productivity without reducing imaging resolution, and should be inexpensive and easy to implement and control.

BRIEF SUMMARY OF THE INVENTION

The present invention overcomes the disadvantages of prior art image transfer systems and methods by inducing changes in light-responsive media from the light of two or more beams.

It is one aspect of the present invention to provide a system and method for illuminating a light-responsive media by combining overlapping light beams on the media, where the intensity of less than all of the overlapping light beams is insufficient to expose the media, and where the combined intensity of all of the overlapping light beams is sufficient to expose the media. In one embodiment of the present invention, the media is a light-responsive material, such as a computer-to-plate printing plate having an integral mask surface. In one embodiment of the present invention, one beam is a background beam of constant intensity formed by a diode bar laser or a fiber-coupled diode laser, and another beam is an imaging beam of controllable intensity formed by a lamp-pumped YAG laser or an ytterbium fiber laser.

It is another aspect of the present invention to provide an apparatus to expose an accepted light-responsive material. The apparatus includes a light source to produce at least two light beams having a combined intensity at a location of the accepted light-responsive material. The light beams include at least one light beam having a controllable intensity, and the combined intensity is controllable between a first combined intensity insufficient to expose an accepted light-responsive material, and a second combined intensity sufficient to expose the accepted light-responsive material. The combined intensity is the sum of the first intensity and the variable intensity. In one embodiment of the present invention, the light beams are a first light beam to produce a first intensity at the location of the accepted light-responsive material, and a second light beam to produce a variable intensity at the location of the accepted light-responsive material.

It is yet another aspect of the present invention to provide an apparatus to ablate a material having an ablation threshold. The apparatus includes a first light source for generating a light beam to illuminate a first area of the accepted light-responsive material, where the intensity of light of the light beam is insufficient to ablate the first area. The apparatus also includes a second light source for generating one or more light beams to each illuminate a corresponding area within the first area, where each of the one or more light beams has a controllable intensity. The intensity of the one or more light beams is insufficient to ablate the corresponding area, and each controllable intensity is controllable between a first intensity and a second intensity. The combined intensity of the first light source and the second light source having the first intensity is insufficient to ablate the corresponding area. The combined intensity of the first light source and the second light source having a second intensity is sufficient to ablate the corresponding area.

It is one aspect of the present invention to provide a method to expose light-responsive materials. The method includes accepting a light-responsive material and providing a light intensity sufficient to expose an area of the accepted light-responsive material. The provided light intensity includes providing a first light beam, and providing a second light beam, where the light intensity of the first provided first light beam and the second provided light beam are individually insufficient to expose the light-responsive material.

It is yet another aspect of the present invention to provide a method for exposing light-responsive materials. The method includes accepting a light-responsive material, and providing an area of the accepted light-responsive material with a light intensity sufficient to ablate the accepted light-responsive material. The exposing includes providing light from a first light source, and providing light from a second light source, where the light intensity of light provided by the first light source and the intensity of light provided by the second light source are individually insufficient to ablate the light-responsive material.

These features together with the various ancillary provisions and features which will become apparent to those skilled in the art from the following detailed description, are attained by the exposure method and apparatus aspects of the present invention, preferred embodiments thereof being shown with reference to the accompanying drawings, by way of example only, wherein:

BRIEF DESCRIPTION OF THE SEVERAL
VIEWS OF THE DRAWING

FIGS. 1A-1G are sectional side views of a digital CTP plate showing a first embodiment method for forming a printing plate, wherein FIG. 1A is a prior art digital CTP plate prior to exposure and FIG. 1B shows a mask of the plate being exposed according to the present invention. FIGS. 1C-1F show prior art steps, where FIG. 1C shows a prior art back exposure, FIG. 1D shows a sectional side view of a prior art main exposure, FIG. 1E shows a prior art washing step, and FIG. 1F shows a prior art drying step. FIG. 1G shows a digital CTP plate after mask ablation according to the present invention and further prior art processing;

FIG. 4A is a first embodiment illumination pattern, FIG. 4B is a second embodiment illumination pattern, and FIG. 4C is a third embodiment illumination pattern;

FIGS. 5A and 5B are sectional side views showing a CTP plate being illuminated with a first flux of the illumination pattern of FIG. 4A prior to illumination (FIG. 5A) and near the end of illumination (FIG. 5B);

FIG. 6A shows separate illumination profiles for the beams of the first and second light sources, and FIG. 6B shows the combined illumination profile for the beams of the first and second light sources.

FIG. 7 is a side sectional view showing a CTP plate being illuminated with a second flux of the illumination pattern of FIG. 4A; and FIG. 8 is a graph of the illumination of FIG. 7.

Reference symbols are used in the Figures to indicate certain components, aspects or features shown therein, with reference symbols common to more than one Figure indicating like components, aspects or features shown therein.

DETAILED DESCRIPTION OF THE INVENTION

The present invention is generally directed to an illumination system and method to transfer images to a surface, and in particular to illumination of areas of the surface with multiple light beams. By way of convenience, the present invention will be described in terms of systems and method for ablating a mask of a digital CTP printing plate using two impinging light beams.

The exposure of a plate according to the present invention is provided by electromagnetic radiation to which the plate is responsive. This electromagnetic radiation may be in one or more of the infrared, visible, or ultraviolet portions of the electromagnetic spectrum. The plate-responsive electromagnetic radiation will also be referred to herein as "radiation." Alternatively, the electromagnetic radiation will be referred to herein as "light," without any limitation in the scope of the present invention. In addition, the electromagnetic radiation is described as issuing from a "light source." It is to be understood that this terminology is not meant to limit the electromagnetic radiation from the light source to any particular portion of the electromagnetic spectrum.

FIGS. 1A-1G are sectional side views that schematically illustrate processing a prior art digital CTP plate 100 (FIG. 1A) into a printing plate 170 (FIG. 1G) by the steps of FIGS. 1B-1F. Plate 100 is a thin, flexible, sheet-like material having a width and length commensurate with the dimensions of an objected to be printed. The sectional views of FIGS. 1A-1G show detail of the thickness of plate 100 into the length of the plate, and do not show the extent of the width of the plate. As will be described subsequently, the steps of FIGS. 1B-1F form raised surfaces 113 on printing plate 170 corresponding to an image to printed, and that can subsequently have ink applied thereto for printing (not shown).

Figure 1:
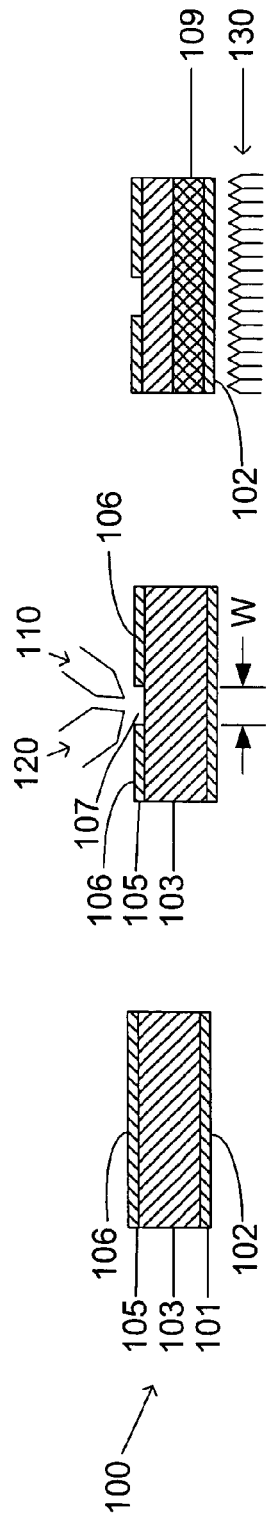

As shown in FIG. 1A, plate 100 has a thickness from a front surface 106 to a back surface, and includes a mask 105, a base 101, and a photo-sensitive material 103 between base 101 and mask 105. Preferably, base 101 is a polyester support layer, material 103 is a photopolymer that polymerizes when exposed to light of a particular range of wavelengths, usually but not limited to UV radiation, and mask 105 is a layer 3-9 micrometer thick of carbon containing ink that is opaque to the radiation that polymerizes material 103 and that is ablative when exposed to a sufficient intensity of light. Thus, for example material 103 can be responsive to a first wavelength (for example, UV radiation) and mask 105 is ablated by absorbing a second wavelength (for example, IR radiation). As described subsequently, a pattern can be formed in mask 105 by ablating the mask in response to the exposure to a first wavelength of light, and the subsequent exposure to light of a second wavelength polymerizes material 103 at the ablated areas. Plates such as plate 100 are know in the art and can be, for example, DUPONT™ CYRELL® (Dupont, Wilmington, Del.), DUPONT™ DPN (Dupont, Wilmington, Del.), DPI, or BASF FAH® (BASF Drucksysteme GmbH, Stuttgart-Feuerbach, Germany)

As shown in FIG. 1B, portions of mask 105 are selectively removed by the application of electromagnetic radiation onto front surface 106 to form openings 107 that expose photo-sensitive material 103. As discussed subsequently with reference to FIGS. 2-6, illumination of front surface 106 includes light from an imaging beam 110 and a background beam 120. As described subsequently, the background beam has an intensity that is constant or that varies slowly during ablation, and the imaging beam 110 has an intensity that can be controlled between a high intensity and a low intensity to determine the speed of the CTP system. Importantly, the combined light of background beam 120 and a high intensity beam 110 at any position on mask 105 are required to ablate the mask, while neither the combined light of background beam 120 and a low intensity beam 110, nor either beams 110 or 120 individually, has sufficient intensity to ablate the mask.

After the step of FIG. 1B, photo-sensitive material 103 has portions that are covered by mask 105 and others having openings 107 in mask 105. The steps of FIGS. 1C-1F are prior art steps for further processing digital CTP plates to form a printing plate, and include exposure of back surface 102 to light in the UV portion of the electromagnet spectrum for forming a polymerized layer 109 of photo-sensitive material 103 (FIG. 1C), a main exposure of front surface 106 to UV light that forms polymerized portions 111 from photo-sensitive material 103 below opening 107 (FIG. 1D), providing a solvent wash 150 to remove material that has not been polymerized and remaining mask material (FIG. 1E), and providing a heated stream of gas 160 to remove solvent (FIG. 1F). After processing via the steps of FIGS. 1B-1F, polymerized material of layer 109 and portion 111 form raised surfaces 113 for the application of ink for printing.

Figure 2:
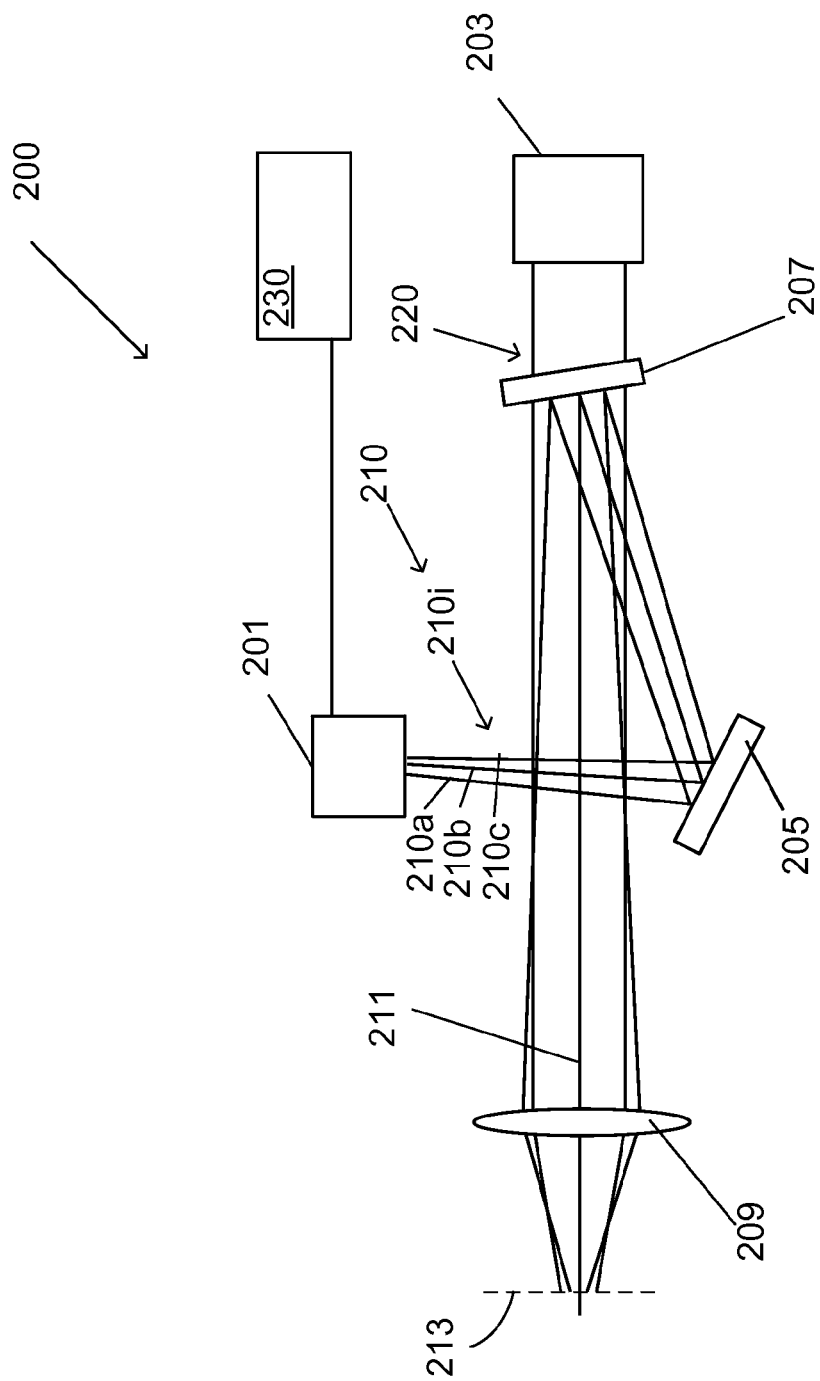
FIG. 2 is a first embodiment illumination system of the present invention.

FIG. 2 is a schematic of a first embodiment system 200 that provides a background beam 220 from a first light source 203 and imaging beams 210 from a second light source 201 at a focal plane 213 for illumination of a plate 100. Imaging beams 210 include several beams of controllable intensity, denoted generally 210i, several of which are shown as beams 210a, 210b, and 210c. A computer system 230 provides signals to second light source 201 to control the power of beams 210i. Illumination system 200 includes a mirror 205, a dichroic mirror 207, and a lens 209. The wavelength of beam 220 differs from that of beams 210, and the optical properties of dichroic mirror 207 are selected to bring the beams into approximate alignment. Specifically, dichroic mirror 207 has wavelength dependent reflection and transmission properties that transmit beam 220 and reflect beams 210. Background beam 220 from light source 203 is transmitted through dichroic mirror 209 long axis 211, where it is also focused by lens 209 onto focal plane 213. Imaging beams 210 are directed by mirror 205 onto dichroic mirror 207, and then are reflected from dichroic mirror 207 along axis 211, and are focused by lens 209 onto focal plane 213.

In general, imaging beams 210 include one or more individual imaging beams 210i that are adjacent at focal plane 213. For the embodiment of FIG. 2, light 210 is formed of 8 imaging beams 210i that are arranged linearly. For example, light source 201 is of a wavelength that that is readily absorbed by mask 105, such as a lamp-pumped YAG laser or an ytterbium fiber laser with output at 1080 nanometer, or a plurality of laser diodes emitting at 830 nm.

Computer system 230 accepts or transforms an image to be transferred into a raster image. The raster image is then mapped onto a slice of the image corresponding to a laser beam track which is used to control the one or more laser beams that transfer that part of the image to the corresponding part of plate 100. The laser intensity is modulated to achieve the proper exposure of the plate. Thus, for example, computer system 230 provides control signals to modulate the power of each beam 210i to produce the required exposure. Alternatively, the number of beams 210i is from 2 to 1024 individual beams. In either case, it is preferable that each beam 210i can be focused by lens 209 to form a spot of from 5 μm to 15 μm with an intensity of from 0.5 W to 5 W. It is also preferable that adjacent beams be positioned to be nearly overlapping at focal plate 213 so that two adjacent beams produce some light flux in the region between the beams.

Light source 203 preferably generates one background beam 220 that is co-focused onto plane 213 with imaging beams 210, and that has an extent on plane 213 that includes each imaging 210i. Imaging beams 210i and 210 are approximately coaxial at each point on front surface 106. While imaging beams 210i are relatively tightly focused and intense beams, background beam 220 is focused to a size that includes all of the individual beam 210 and has an intensity that is from 5 W to 50 W. Preferably the flux of background beam 220 is approximately constant across plane 213, though there is no need for the flux to be uniform. Thus, for example, light source 203 can be a relatively inexpensive diode bar laser or a fiber-coupled diode laser having a high $M^2$ value. Thus the majority of power for ablation is delivered by a relatively low cost light source, while control of ablation is performed by increasing the power to individual ones of beams 210i.

In one embodiment, background beam 220 a constant power that is less than that required for ablation of mask 105, and each imaging beam 210i is controllable between a first, low power level to deliver a combined light that is insufficient to ablate the mask, and a second, high power level that delivers a combined light that is sufficient to ablate the mask. The individual beams, such as beams 210a, 210b, and 210c, have individually controllable intensities that, in combination with movement of mask 100 relative to illumination system 200 controllably ablate mask 105, as discussed subsequently.

Figure 3:
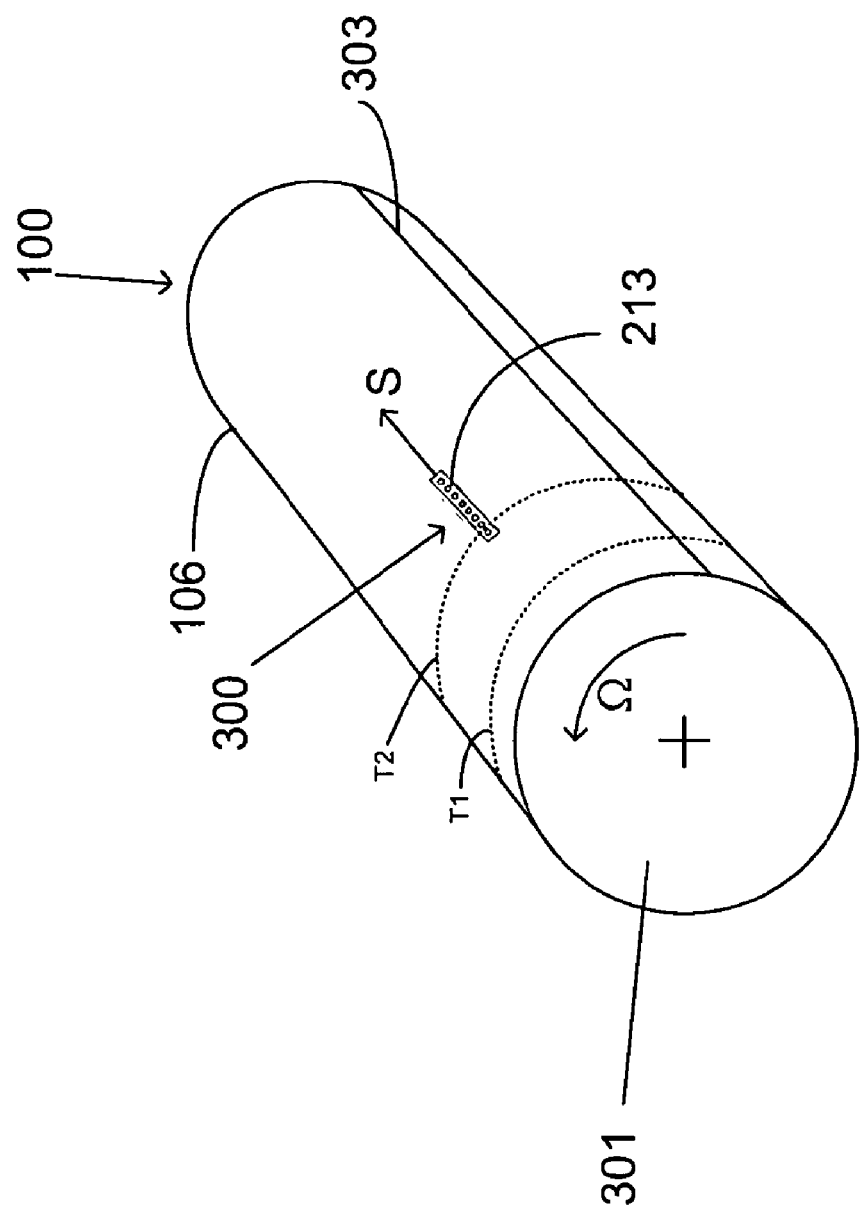
FIG. 3 is a perspective view of a plate being exposed according to FIG. 1B with the illumination system of FIG. 2.

The use of illumination system 200 to expose plate 100 is shown with reference to FIG. 3. The apparatus of FIG. 3 is know in the field, and can be, for example, a Spark XT (Esko-Graphics, Gent, Belgium). Plate 100 is flexible and is wrapped about the outside of a cylindrical drum 301 and held in place by vacuum or by tape with edges touching to form a joint 303. Illumination system 200 is positioned such that focal plane 213 is on surface 106 with the beams 210i arranged along the axial direction of drum 301, as indicated by the illuminated area 300. Drum 301 rotates with a speed Ω, typically greater than 200 rotations per minute. While drum 301 rotates, illumination system 200 translates in what is called the slow scan direction parallel to the drum axis, as indicated by the arrow S. The focal plane 213 thus sweeps as illuminated area 300 traverses in the axial direction of drum 301. The motion of focal plane 213 in the slow-scan direction S is such that beams 210 and 220 sweep across plate 100. Thus as a result of the combined rotation of the drum and the translation of the focal plane, the illuminated area traces out a helical path T, with two tracks in what is called the fast-scan direction shown as T1 and T2 on sequential rotations of cylinder 301. Ablation of specific portions of mask 105 occurs by controlling, through a computer (not shown), the intensity of one or more of the beams 210i.

Figure 4C:
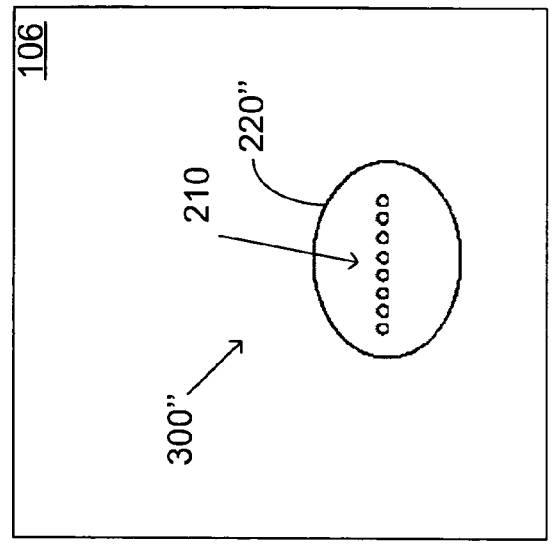
FIGS. 4A-4C are top views of the printing plate illustrating three embodiments of the illumination generated by the illumination system of FIG. 2, where
Figure 4B:
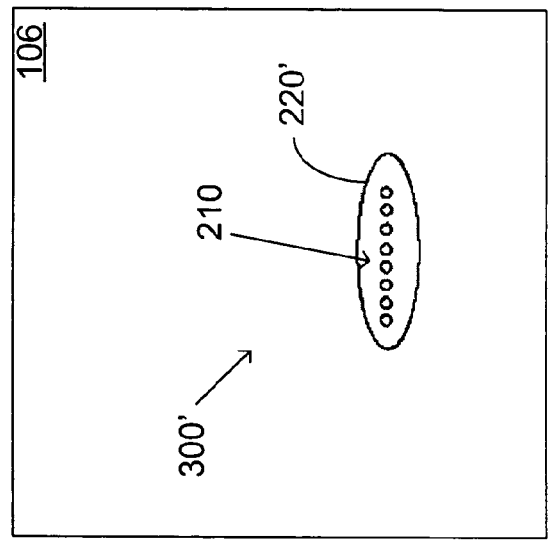
Figure 4A:
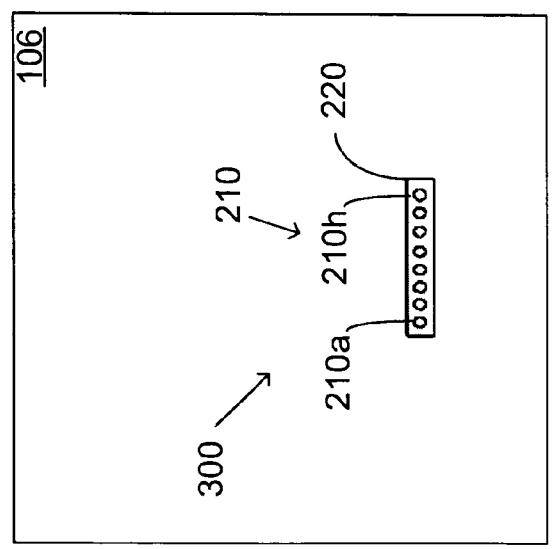

The shape of the beams 210 and 220 affect the illumination pattern as illustrated in FIGS. 4A-4C, which are top views of front surface 106 according to a first embodiment illumination pattern 300, a second embodiment illumination pattern 300', and third embodiment illumination pattern 300", respectively. More specifically, the illumination pattern is the combination of illumination from light 220 and one or all of beams 210i. The power distribution of the illumination of light 220 is preferably large enough to include each beam 210i and not disperse the energy over too large an area, thus keeping the power of illumination closely confined to the areas that can be ablated according to the power of individual beams 210i.

As shown in the FIGS. 4A-4C, the outline of each of the beams of light 210 is approximately circular. Since any one, or all, of beams 210i can be powered, the circular patterns shown for light 210 represent illumination of any or all of beams 210i. FIG. 4A shows the outline of illumination from a rectangular-shaped beam of light 220, FIG. 4B shows the outline of illumination from an oval-shaped beam of light 220', and FIG. 4C shows the outline of illumination from a more circular-shaped beam of light 220". In each embodiment, light 220 surrounds each light 210. It is preferred that light 220 have the more rectangular shape of FIG. 4A to more effectively use the ablative power from light sources 201 and 203.

There are several advantages of having light 220 provide slightly less than the amount of light required to ablate mask 105 and having individual imaging beams 210i provide a boost to ablate the mask. First, the total power of light source 201 is reduced as the power of light 203 is increased. Since light source 201 is more expensive, per watt, than light source 203, the higher the illumination by light 220, the less expensive the system. Second, the continuous deposition of power surrounding each beam 210i reduces condensation of ablated material, particularly between imaging beams, improving the resolution and quality of shaped of the ablated mask and allowing for more power for ablating, thus allowing for increased productivity.

Figure 6A:
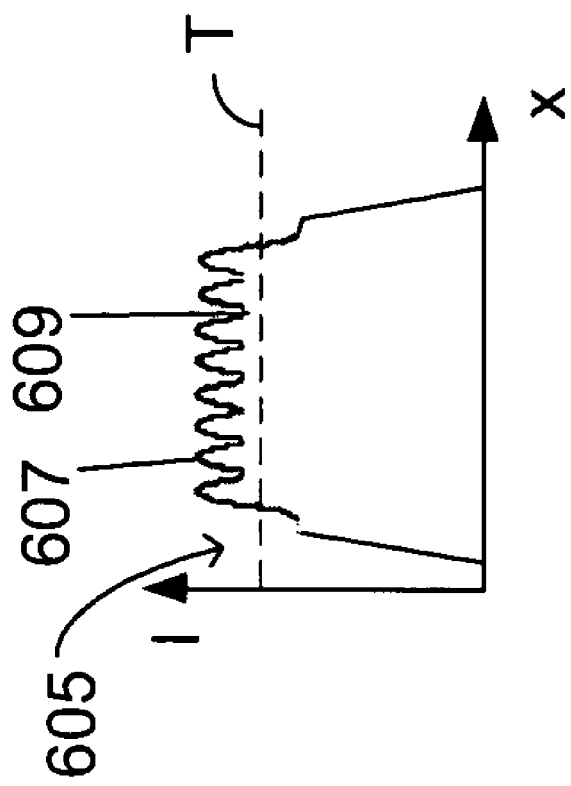
FIGS. 6A-6B are graphs of the first illumination pattern of FIGS. 5A and 5B, where
Figure 6B:
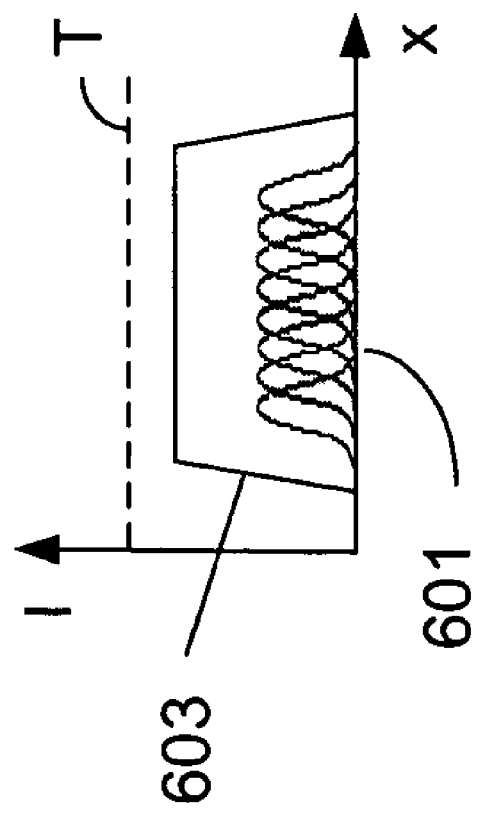

FIGS. 5A and 5B shows a sectional side view of CTP plate 100 being illuminated with a first flux including all of the light of light 220 and each beam 210i of FIG. 4A prior to illumination (FIG. 5A) and near the end of illumination (FIG. 5B), and FIGS. 6A and 6B are graphs of the fluxes of individual beams (FIG. 6A) and the combined beams (FIG. 6B) along the surface of the plate. As shown in FIG. 5A, light 220 is a single beam that surrounds beams 210i, which include 8 separate, adjoining beams. As described previously, the flux from light 220 is sufficient to heat mask 105 to just below the temperature for ablation, while ablation of mask 105 is controlled through a controllable incremental power of individual ones of beams 210i. The individual fluxes on plate 100 from light 220 and beams 210i are shown in FIG. 6A as curve 601, which is the flux from each one of beam 210i, and as curve 603, which is the flux from light 220. Each beam 210i has a high flux at the beam center, with a flux that decrease near the edge and that overlaps with fluxes of adjacent beams.

Also shown in FIGS. 6A and 6B is a threshold T, which represents the amount of illumination necessary to ablate mask 105. As noted previously, ablation results from sufficient heating of mask 105 and thus depends on thermal and optical properties of plate 100 as well as the incident light flux and heating time. The indication of threshold T is qualitative and is meant to indicate the flux required to ablate a specific mask when heated for a specific amount of time. The flux of individual fluxes of any one of light 220 and beams 210i is less than threshold T, with the flux of light 220 just below that necessary for ablation to occur.

The combined illumination (the sum of all of curves 601 and 603) is shown as curve 605 in FIG. 6B. Curve 605 has peaks 607 and troughs 609 due to the peaked provides of beams 210i. The illumination is selected so that the combined light of light 220 and beams 210i exceeds threshold T. Since the illumination exceeds threshold T across peaks 607 and troughs 609, the region illuminated by both light sources ablates mask 105 to form opening 107, as illustrated in FIG. 5B. The illumination of plate 100 from the two sources has the added advantage of eliminating or reducing the condensation of ablated material, resulting in higher definition and better use of ablative power.

The formation of openings 107 using a second flux that includes powering only some of beams 210i is shown in FIG. 7, as plate 100 being illuminated with 6 of the 8 beams according to the illumination pattern of FIG. 4A, and in FIG. 8 is a graph of the illumination of FIG. 7. FIG. 7 shows the position of individual beams 210i as imaging beams 210a, 210c, 210d, 210e, 210f, and 210h, and shows the position of unpowered beams 210b and 210g in phantom. Also shown in FIG. 7 are regions where opening 107 has been formed under imaging beams 210a, 210c, 210d, 210e, 210f, and 210h, and regions where mask 105 remains at the positions where beams 210b and 210g would be impinging on mask 105 if they were powered.

The illumination flux across the surface of plate 100 is shown as curve 800 of FIG. 8. Also shown in FIG. 8 are the locations of each of the beams 210i, mask 105 and opening 107. The absence of a powered beam between two other powered beams, for example the sequential beams 210a-210c, results in a flux that is below threshold T and the formation of an isolated region of mask 105 on plate 100.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment. Furthermore, the particular features, structures or characteristics may be combined in any suitable manner, as would be apparent to one of ordinary skill in the art from this disclosure, in one or more embodiments.

Similarly, it should be appreciated that in the above description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the Detailed Description are hereby expressly incorporated into this Detailed Description, with each claim standing on its own as a separate embodiment of this invention.

Thus, while there has been described what is believed to be the preferred embodiments of the invention, those skilled in the art will recognize that other and further modifications may be made thereto without departing from the spirit of the invention, and it is intended to claim all such changes and modifications as fall within the scope of the invention. For example, the multiple beams that combine to ablate the mask need to impinge the same location, but need not be coaxial. Also, ablation of the mask of the CTP plate can result from simultaneous illumination of more than two beams. Steps may be added or deleted to methods described within the scope of the present invention. In addition, it will be apparent to those skilled in the art that the invention can be applied for transferring or exposing other materials by ablating or by inducing thermal or chemical changes to materials that are light-responsive, including, but not limited to, plates for offset printing, for example, lithography and offset rotary press printing, and other printing systems, for example, relief printing, screen printing, flexo printing, and gravure printing. Thus, for example, a required flux or total energy of electromagnetic radiation required to induce a thermal or chemical change in a material, including but not limited to curing or etching, is provided, according to the present invention, by the combined flux or energy from the combination of two or more beams or light from two or more sources.

I claim:

1. An apparatus to expose a light-responsive material in response to imaging data, the apparatus comprising:
   one or more light sources configured to produce a set of light beams at a location on the light-responsive material, the light beams including at least one beam operative to provide an unmodulated background intensity to an area at the location, and a plurality of modulated non-overlapping beams each beam at a respective intensity modulated according to a respective portion of the imaging data and directed within the area,
   such that the light-responsive material at the area is exposed to a combined intensity of the background intensity combined with the respective modulated intensities of the plurality of modulated beams such that the combined intensity is controllable between a first combined intensity that is insufficient to properly expose the light-responsive material; and a second combined intensity sufficient to properly expose the light-responsive material.

2. An apparatus as recited in claim 1, wherein the set of light beams are approximately coaxial at the location.

3. An apparatus as recited in claim 2, wherein the light-responsive material is ablatable, and wherein the light sources are operative when at the second combined intensity to ablate the light-responsive material according to the imaging data.

4. An apparatus as recited in claim 1, wherein the light-responsive material is ablatable, wherein the second combined intensity is sufficient to ablate the light-responsive material according to the imaging data, such that the light sources are operative when at the second combined intensity to expose the light-responsive material by providing illumination above a threshold illumination sufficient to ablate the ablative light-responsive material according to the imaging data.

5. An apparatus as recited in claim 1, wherein light sources are generated by a first light source and a second light source, wherein the at least one beam operative to provide a background intensity is generated by the first light source, and wherein the plurality of modulated beams is generated by the second light source.

6. An apparatus as recited in claim 5, wherein the second light source is operative to illuminate two or more circular areas at the location on the light-responsive material, and wherein the first light source is operative to illuminate the area, the area extending around the two or more circular areas at the location on the light-responsive material.

7. An apparatus as recited in claim 6, wherein the two or more circular areas are linearly arranged relative to each other, and wherein the area extending around the two or more circular area is approximately rectangular.

8. An apparatus as recited in claim 5, wherein the first light source is a diode bar laser or a fiber-coupled diode laser.

9. An apparatus as recited in claim 5, wherein the second light source is a lamp-pumped YAG laser or an ytterbium fiber laser.

10. An apparatus as recited in claim 1, wherein the light-responsive material is a printing plate.

11. An apparatus as recited in claim 10, wherein the printing plate is a computer-to-plate printing plate having an integral mask surface, and wherein the mask surface of the light-responsive plate is oriented towards the set of light beams.

12. A method of exposing a light-responsive material, the method comprising:
    receiving imaging data; and
    exposing a location on the light-responsive material by a combination of a set of light beams, the set of light beams including at least one beam operative to provide an unmodulated background intensity to an area at the location, and a plurality of non-overlapping modulated beams, each at a respective intensity modulated according to a respective portion of the imaging data and directed within the area.
    such that the light-responsive material at the area is exposed to a combined intensity of the combination of the background intensity combined with the respective modulated intensities of the plurality of modulated beams such that the combined intensity is controllable between a first combined intensity that is insufficient to properly expose the light-responsive material; and a second combined intensity sufficient to properly expose the light-responsive material.

13. A method as recited in claim 12, wherein the at least one beam operative to provide a background intensity without the plurality of modulated beams provides a combined intensity insufficient to properly expose the light-responsive material at the location, and wherein the plurality of modulated beams without the at least one beam operative to provide a background intensity provides a combined intensity also insufficient to properly expose the light-responsive material.

14. A method as recited in claim 13, wherein the at least one beam operative to provide a background intensity produces an intensity that is not modulated according to the imaging data.

15. A method as recited in claim 13, wherein the at least one beam operative to provide a background intensity relatively low beam quality, and wherein each modulated beam of the plurality has a relatively high quality.

16. A method as recited in claim 13, wherein the at least one beam operative to provide a background intensity and the plurality of modulated beams are approximately coaxial at the location such that the background intensity surrounds each of the modulated beams at the light-responsive material.

17. A method as recited in claim 13, wherein the plurality of modulated beams illuminate two or more respective circular areas, and wherein the at least one beam operative to provide a background intensity illuminates the area, the area extending around the two or more circular areas.

18. A method as recited in claim 17 wherein the two or more circular areas are linearly arranged with respect to each other, and wherein the area extending around the two or more circular area is approximately rectangular.

19. A method as recited in claim 13, wherein the at least one beam operative to provide a background intensity is generated by a light source of relatively low brightness.

20. A method as recited in claim 13, wherein the at least one beam operative to provide a background intensity is generated by a diode bar laser or a fiber-coupled diode laser.

21. A method as recited in claim 13, wherein the plurality of modulated beams is generated by a lamp-pumped YAG laser or an ytterbium fiber laser.

22. A method as recited in claim 13, wherein the light-responsive material is a printing plate.

23. A method as recited in claim 22, wherein the printing plate is a computer-to-plate printing plate having an integral mask surface, and wherein the mask surface of the light-responsive plate is oriented towards the direction from which the at least one beam operative to provide a background intensity and the plurality of modulated beams propagate.

* * * * *

UNITED STATES PATENT AND TRADEMARK OFFICE
CERTIFICATE OF CORRECTION

| | | |
|---|---|---|
| PATENT NO. | : 8,013,887 B2 | Page 1 of 1 |
| APPLICATION NO. | : 11/840796 | |
| DATED | : September 6, 2011 | |
| INVENTOR(S) | : Sievers | |

It is certified that error appears in the above-identified patent and that said Letters Patent is hereby corrected as shown below:

In Column 5, line 19, after "DUPONT™", kindly replace "CYRELL®" with --CYREL®--.

In Column 10, line 42, after "the", kindly replace "area." with --area,--.

Signed and Sealed this
Twenty-second Day of November, 2011

David J. Kappos
*Director of the United States Patent and Trademark Office*